United States Patent [19]

Minagawa

[11] Patent Number: 5,754,842

[45] Date of Patent: May 19, 1998

[54] PREPARATION SYSTEM FOR AUTOMATICALLY PREPARING AND PROCESSING A CAD LIBRARY MODEL

[75] Inventor: Eiji Minagawa, Kawasaki, Japan

[73] Assignee: Fujitsu Limited, Kawasaki, Japan

[21] Appl. No.: 573,752

[22] Filed: Dec. 18, 1995

Related U.S. Application Data

[63] Continuation of Ser. No. 252,002, May 31, 1994, abandoned.

[30] Foreign Application Priority Data

Sep. 17, 1993 [JP] Japan .................... 5-231647

[51] Int. Cl.$^6$ .................................. G06F 17/30
[52] U.S. Cl. .................. 395/604; 395/601; 395/603; 395/613; 395/614; 364/491; 364/468.03
[58] Field of Search ............... 395/600, 601, 395/603, 604, 613, 614; 364/490, 489, 491, 468.03

[56] References Cited

U.S. PATENT DOCUMENTS

| | | | |
|---|---|---|---|
| 4,752,887 | 6/1988 | Kuwahara | 364/491 |
| 4,975,854 | 12/1990 | Yabe | 364/491 |
| 5,038,294 | 8/1991 | Arakawa et al. | 364/491 |
| 5,220,512 | 6/1993 | Watkins et al. | 364/489 |
| 5,267,154 | 11/1993 | Takuchi et al. | 364/419.2 |
| 5,272,641 | 12/1993 | Ford et al. | 364/468 |
| 5,315,534 | 5/1994 | Schlachet | 364/490 |

OTHER PUBLICATIONS

Pascal Vaxiviere et al., "Celesstin: CAD Conversion of Mechanical Drawings", IEEE, vol. 25, pp. 46–54, Jul. 1992.
Ton Kostelijk and Bart De Loore, "Automatic Verification of Library–Based", IEEE, vol. 26, pp. 394–403, Mar. 1991.
Kortelijk et al., "Automatic Verification of library–Based IC designs", IEEE; Mar. 1991; pp. 394–403.

*Primary Examiner*—Thomas G. Black
*Assistant Examiner*—Cheryl Lewis
*Attorney, Agent, or Firm*—Staas & Halsey

[57] ABSTRACT

A preparation system for CAD library model includes: a library model file for storing present CAD library models; a first external data file for storing first external data inputted by an operator; a management file for storing lists of the present CAD library models; a work file for storing character data, coordinate data and connection data of a circuit model; a second external data file for storing second external data inputted by the operator; a data editing and processing unit for performing edition and process of the new CAD library model based on the present CAD library model and the first/second external data; a preparation and addition unit for preparing the new CAD library models and adding them into the present CAD library model in accordance with contents of the data editing and processing unit and the word file; and a library model file for storing new CAD library models.

9 Claims, 6 Drawing Sheets

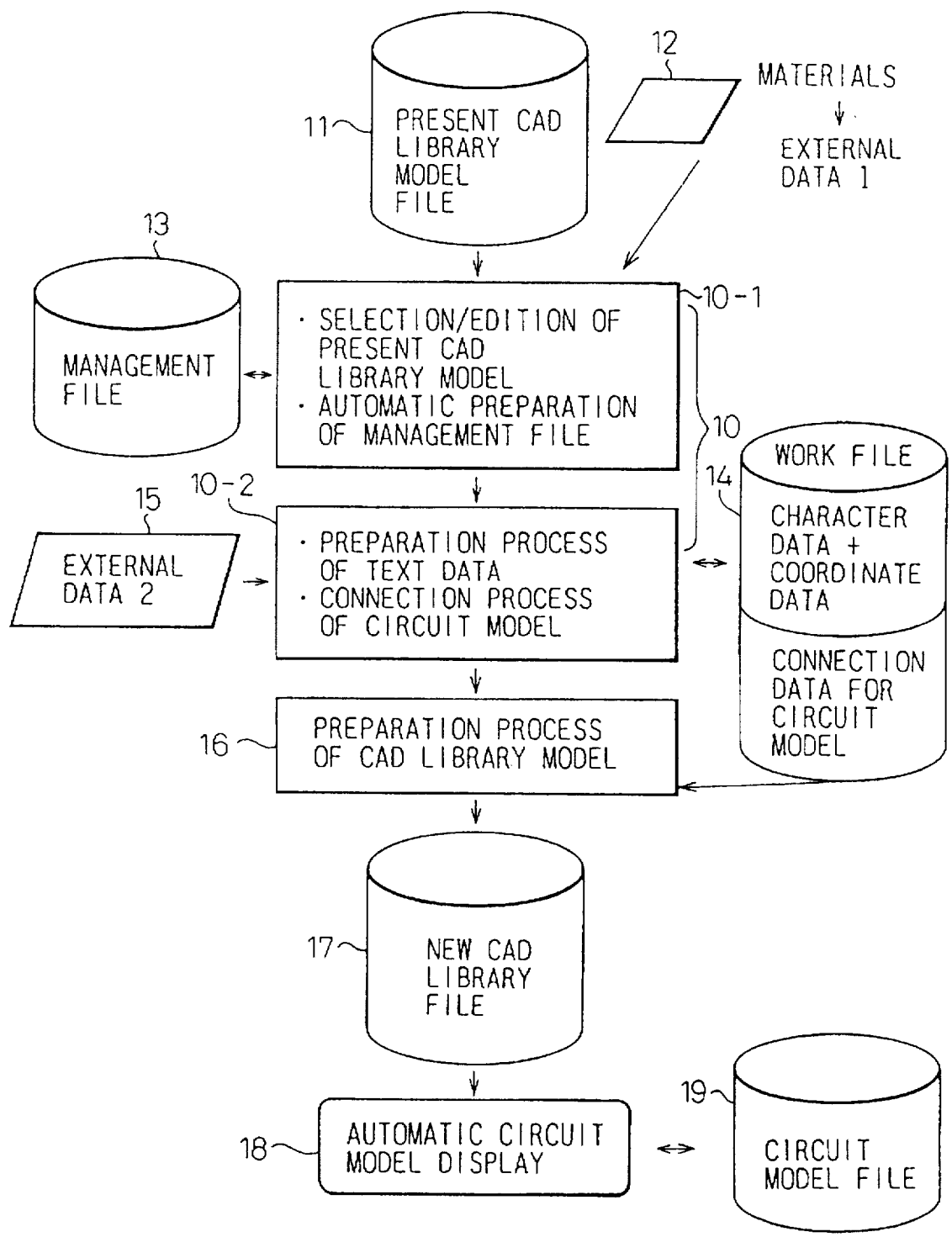

A : FUNCTION NAME
OA,OB : SYMBOL PIN
a,b : SYMBOL SIZE a,b = SHAPE SIZE

Fig.5E
```
TYPE                TYPE
  A : AA1;            A : AA1;
  B : BB1;            B : BB1;
ENDTYPE;            ENDTYPE;
             ⇒      NET;                  } AUTOMATIC
                      X1:AA1.C,BB1.O2;    } PREPARATION
                    ENDNET;
```

Fig.5F
```
CONECTION DATA ON LIBRARY DATA
  ⇒ A(C)-B(O2)
```

Fig.6A
```
NAME : CIRCUIT PART NAME
FUNTION NAME : xxxx
    ----CHARACTER DATA(SYMBOL DATA)----<PIN FUNCTION NAME> <CONNECTION DATA>
SYMBOL1:xxxxx
PIN    : ( 0A)  — ( 01) — (IN) — <PIN FUNCTION NAME>
       : ( 0B)  —        — (IN) — <PIN FUNCTION NAME>
```

Fig.6B
```
    ----COORDINATE DATA(SYMBOL DATA)----
SYMBOL2:xxxxx  — (xxx0,yyy0,XXX0,YYY0)   →SYMBOL SIZE
       : ( 0A) — (xxx1,yyy1)             →SYMBOL PIN COORDINATE
       : ( 0B) — (xxx2,yyy2)             →SYMBOL PIN COORDINATE
```

Fig.6C
```
    ----CHARACTER DATA(PART SHAPE DATA)----
TYPE1  :tttttt
       :( 01) — (ROUND-No.) — (KIND OF ROUND)
       :( 02) — (ROUND-No.) — (KIND OF ROUND)
```

Fig.6D
```
    ----COORDINATE DATA(PART SHAPE DATA)----
TYPE1  :tttttt  — (xxx0,yyy0,XXX0,YYY0)   →PART SHAPE SIZE
       :mmm (xxx1,yyy1,XXX1,YYY1)          →MARKING COORDINATE
       :( 01) — (xxx1,yyy1)                →PIN COORDINATE
       :( 02) — (xxx2,yyy2)                →PIN COORDINATE
```

Fig.6E
```
    ----CHARACTER DATA(PART DATA)----
NAME   : LS04,VERSION,TYPE,              →CHARACTER DATA
```

PREPARATION SYSTEM FOR AUTOMATICALLY PREPARING AND PROCESSING A CAD LIBRARY MODEL

This application is a continuation of application Ser. No. 08/252,002, filed May 31, 1994, now abandoned.

BACKGROUND OF THE INVENTION

1. Field of the Invention

The present invention relates to a preparation system for a CAD library model, and more particularly, it relates to a method and apparatus for preparing new CAD library models based on present CAD library models, data presented by an external stage (for example, by a circuit designer), and a management file for the CAD library models.

2. Description of the Prior Art

CAD library models are used for designing logic circuits using a CAD system. A CAD library model includes data regarding a symbol and its shape (below, symbol data), data regarding a function of a logic circuit (below, function data), and data regarding shape and size of a circuit part used in the actual design of the logic circuit (below, part shape data). These data are stored and managed for every part and symbol in a CAD file, and used when the circuit designer designs, for example, a layout and logic circuit of a printed-circuit board using a CAD system.

In the conventional art, most portions of the CAD library model are prepared and processed manually so that a lot of time is required to design a circuit model. Further, it is required to have particular knowledge when preparing the CAD library model. Accordingly, the present invention aims to automatically prepare and process the CAD library model without any particular knowledge as explained in detail below.

SUMMARY OF THE INVENTION

The object of the present invention is to provide a preparation system for CAD library model which automatically prepares and processes the CAD library model, reduces working time and errors during the design of a circuit model, and improves the reliability and quality of the CAD library model.

In accordance with the present invention, there is provided a preparation system for CAD library model which includes: a library model file for storing present CAD library models; a first external data file for storing first external data inputted by an operator; a management file for storing lists of the present CAD library models; a work file for storing character data, coordinate data and connection data of a circuit model; a second external data file for storing second external data inputted by the operator; a data editing and processing unit for receiving the present CAD library models and the first external instruction data, extracting relevant model data from the management file, selecting an optimum present model data based on the present CAD library models and the first external instruction data, registering the optimum present data into the management file, preparing text data consisting of character data and coordinate data and storing them into the work file, and performing connection processes based on external connection data and storing new connection data into the work file; a preparation and addition unit for preparing the new CAD library models and adding them into the present CAD library model in accordance with contents of the data editing and processing unit means and the work file; and a library model file for storing new CAD library models.

In one preferred embodiment, the first external data includes function data, part shape data, pin position data and symbol data.

In another preferred embodiment, the second external data includes connection data for the circuit model.

In still another preferred embodiment, the character data and coordinate data include the symbol data, part shape data and part data.

In still another preferred embodiment, the character data, the coordinate data and the connection data are stored in accordance with an ASCII image.

BRIEF DESCRIPTION OF THE DRAWINGS

In the drawings

FIG. 3 is schematic block diagram of a preparation system for CAD library model used in the present invention;

FIGS. 5A to 5E are explanatory views of the CAD library model;

FIG. 5F is an explanatory view of connection information in the library data; and FIGS. 6A to 6E show an example of a detailed working file according to the present invention.

DESCRIPTION OF THE PREFERRED EMBODIMENTS

Before describing the preferred embodiments, a conventional art and its problem will be explained below.

Figure 1:
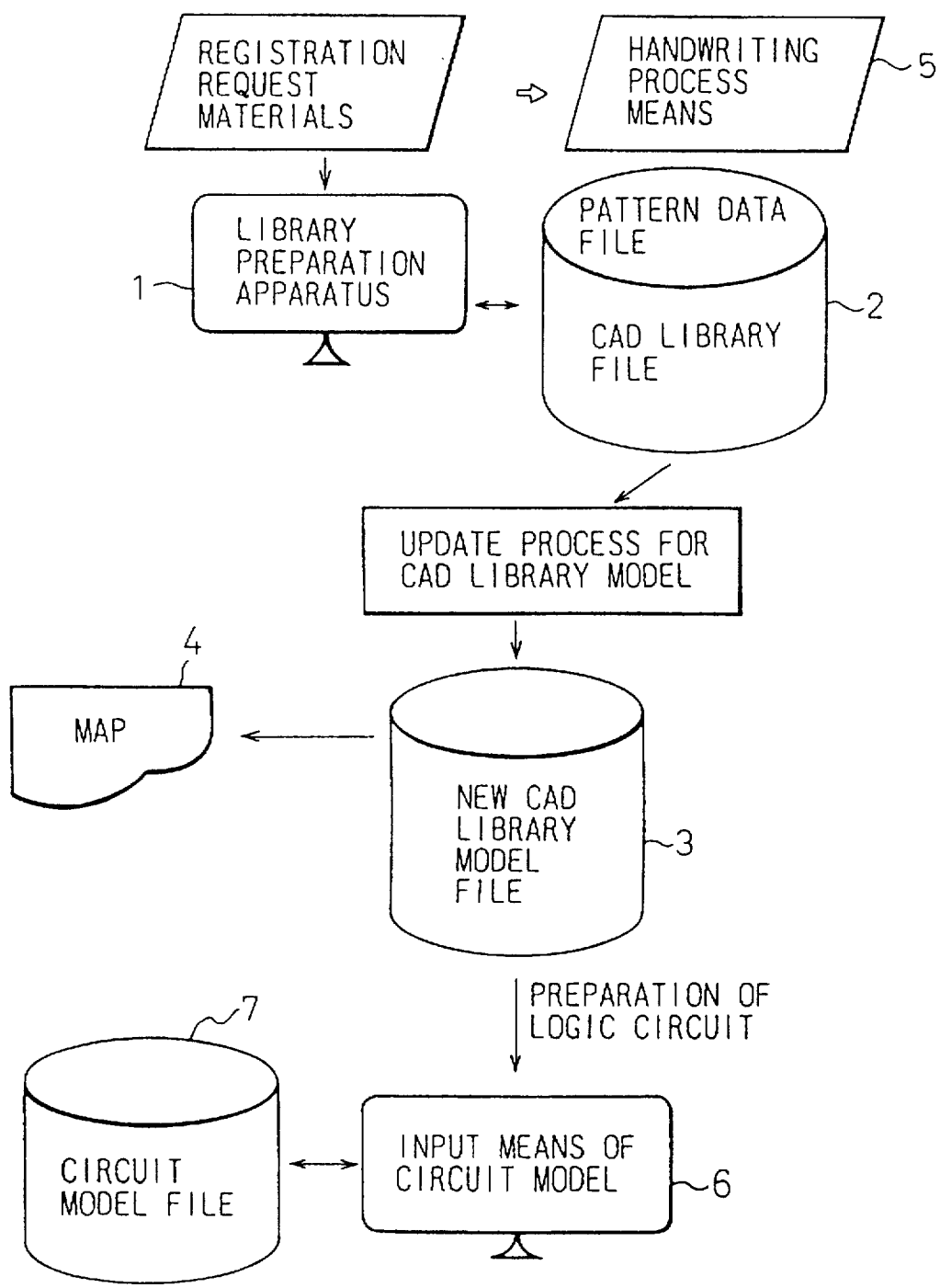
FIG. 1 is an explanatory view for preparing a conventional CAD library model.

FIG. 1 is an explanatory view for preparing a conventional CAD library model. Reference number 1 denotes a library preparation apparatus having a graphic-pattern display, reference number 2 denotes a file for preparing a CAD library (below, CAD library file) which stores pattern images of the conventional CAD library model, reference number 3 denotes a new CAD library model file, reference number 4 denotes a map for confirming contents of the new CAD library model, reference number 5 denotes a handwriting process means for inputting registration/change/confirmation, reference number 6 denotes an input means of a circuit model, and reference number 7 denotes a circuit model file.

As one conventional method, the CAD library model is prepared in such a way that, through the graphic pattern displayed on the library preparation apparatus 1 and through an interactive type input means, the operator manually prepares a CAD library model by referring to the CAD library file 2.

As another conventional method, the operator inputs the CAD library model through a keyboard, a mouse, and a pen-keyboard, in order to prepare the pattern data file 2. Further, the operator prepares data for the new CAD library model 3 after updating the CAD library model. Further, the map 4 is provided for confirming the contents of the new CAD library model. This confirmation of contents of the new CAD library model 3 is also performed manually by the operator in accordance with the map 4.

In the above conventional art, all processes are dependent on an operator having particular knowledge. That is, if the operator has no particular knowledge, it is difficult to prepare the CAD library model and confirm whether or not the CAD library model is correct. Further, if the CAD library model is incorrect, a failure occurs in the design and layout of the logic circuit so that the actually designed circuit is not reliable.

Further, in above conventional art, when preparing, managing and checking of the new CAD library model, these operations are dependent on the work of a particular operator. Further, as a management method of the CAD library model, the pattern data file 2 for only the CAD library model is provided for maintenance and management of the CAD data.

Still further, the following are also dependent on work of a particular operator through the hand-writing input means 5. That is, the operator performs reception of registration, management of change of the CAD library model, and confirmation of the CAD library model through the hand-writing means 5. The operator manually manages materials which are requested by the operator, and manages registration and change processes. Accordingly, since these processes are separately managed from the data of the CAD library model, it is difficult to improve the reliability of the CAD library model so that undesirable influence occurs when preparing the printed-circuit.

The object of the present invention lies in automatic preparation and management of the CAD library model. According to the present invention, it is possible to reduce preparation time for inputting the circuit model, to reduce errors during the preparation process, to increase the reliability and quality of the CAD library model and to reduce the costs to prepare the CAD library model because the operator does not need to input the CAD library model manually.

Figure 2:
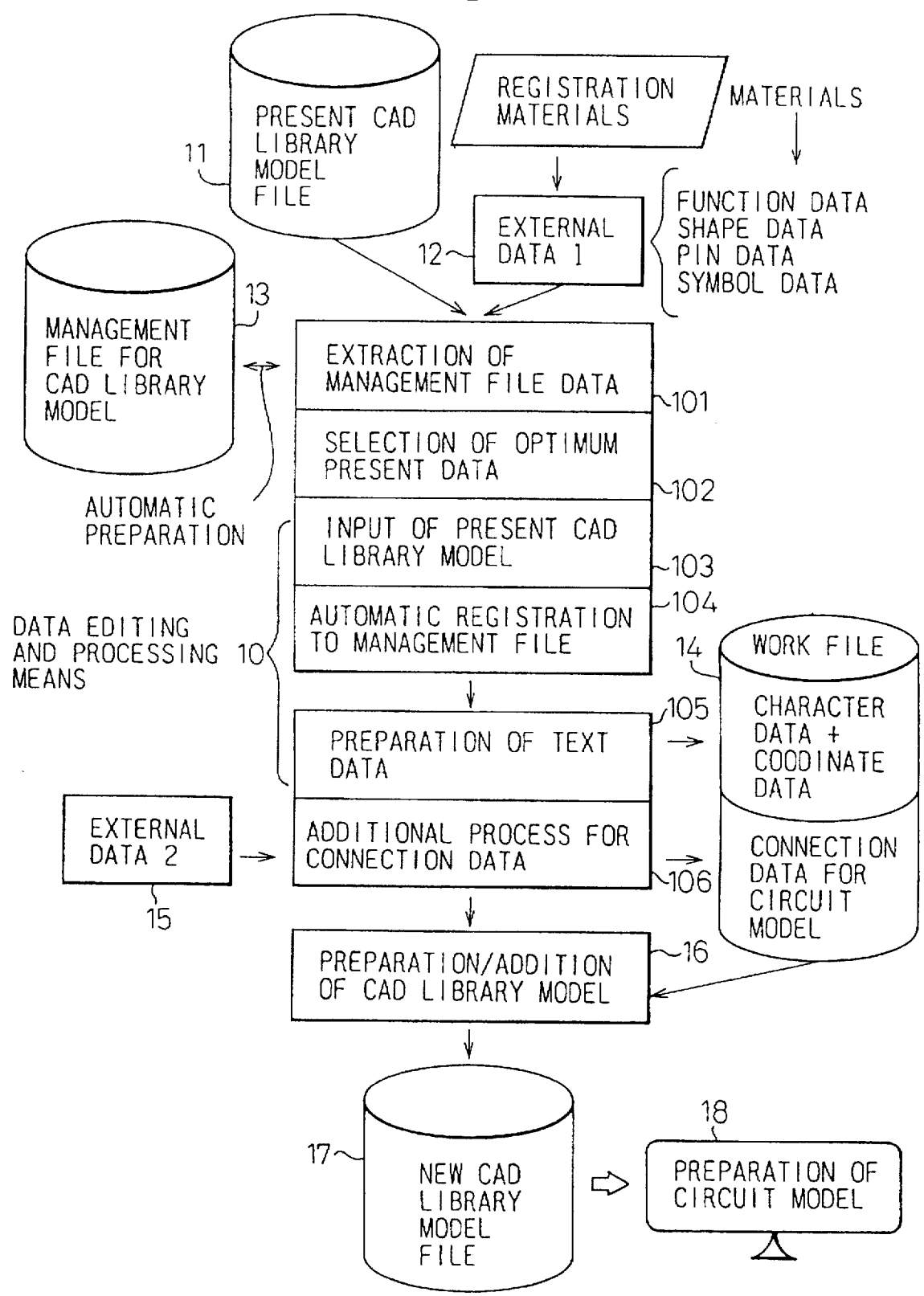
FIG. 2 is a schematic block diagram of a preparation system for CAD library model according to an embodiment of the present invention.

FIG. 2 is a schematic block diagram of a preparation system for a CAD library model according to an embodiment of the present invention. The preparation system for the CAD library model is formed of: a file 11 for storing a present CAD library model (below, present CAD library model file); a file 12 for storing one external instruction data 1 as control data, for example, a function, a size of a part, a pin position on a part, and symbol information; a management file 13 for storing a list of function data, a size of a part, and symbol information; a data editing and processing means 10 for performing various management functions; a work file 14 for storing character data plus coordinate data and the connection information for the circuit model using an ASCII image; a file 15 for storing other instruction data 2 regarding connection information of the circuit model; and a library preparation means 16 for preparing the new CAD library model.

The data editing and processing means 10 inputs the present CAD library model and the external instruction data 1, extracts the data from the management file, selects an optimum present data, and registers them into management file, in accordance with the external instruction data 1. Further, the editing and processing means 10 automatically prepares the CAD library model through the management file 13, prepares text data, performs connection processes for the circuit model in accordance with an external instruction data 2, and stores the result of these processes into the work file 14.

The CAD library model preparation and addition means 16 prepares the new CAD library model or adds the new model into the present CAD library model in accordance with the contents of the work file 14 and the data editing and processing means 10. The external instruction data 1 includes a preparation control data for the library similar to the present model, the preparation control data for a symbol data and the preparation control data for a shape of part. Further, the external instruction data 2 includes preparation control data for connection information for the circuit model.

Further, the management file 13 includes situation data of the present library regarding reception/registration/change, the list of the function data of the present library, the list of the symbol data of the present library, and the list of the part external-shape data of the present library. Further, the data and coordinate data of the work file 14 includes the symbol data, the part data, and the external shape data of the part.

The CAD library model according to the present invention utilizes the present CAD library model 11 in order to quickly prepare the new CAD library model which matches the request from the operator by changing and revising the present model. Regarding the contents of the external instruction data 1, when the function and the number of the pins are the same, but the voltage and current rating are different from the present model, or when the size and shape of the part are the same, but the number of the pins is larger than the present model, the operator inputs the present CAD library model into the external instruction data 1 and the management file 13, and selects the optimum data from the present model data.

Further, in accordance with the selected contents and the external instruction data 1, the data editing and processing means 10 automatically prepares the work file 14 of the text image regarding the data which it intends to newly prepare. Accordingly, it is possible to prepare the CAD library model without manual work of the operator.

As explained above, according to the present invention, the CAD library model is prepared by adding the external instruction data 1 and 2. As a result, it is possible to considerably reduce time to prepare, and errors in the CAD library model. Accordingly, it is possible to automatically generate connection information for the circuit model by storing the particular connection information of the circuit model in the CAD library model.

The operation of FIG. 2 is explained in detail as follows. The present data are input from the present CAD library model to the data editing and processing means 10. Further, the external instruction data 1 from the operator, for example, function information, part external shape information, part pin information, and symbol information are inputted into the data editing and processing means 10 in accordance with the material in which the registration is requested. Still further, the data editing and processing means 10 automatically manages the following contents through the management file 13.

The data editing and processing means 10 extracts the data from the management file 13 (101) and selects an optimum present data (102). At that time, the editing and processing means 10 confirms the symbol, the part external shape and the part function, and selects the present data which are the most similar to the data which it intends to prepare. Further, the data editing and processing means 10 automatically registers the data of reception/preparation/registration into the management file 13 (104).

Further, the data editing and processing means 10 prepares the text data based on the ASCII image which are divided into the character data and the coordinate data (105), stores the text data into the working file 14, adds connection information of the circuit model which is provided from the file 15 for the external instruction data (106), and prepares the CAD library model as the data including connection information of the circuit model (16). As a result, the new CAD library models are stored in the new CAD library model file 17, and the circuit model is prepared in the circuit model preparation apparatus 18 based on the new CAD library model 17. Further, the working file 14 stores the character data plus the coordinate data and connection information of the circuit model.

As explained above, in the present invention the data editing and processing means 10 inputs guide data having selected items of data, which indicates the present data to be selected from the present CAD library model, through the external instruction data 1 and the management file 13, and selects the optimum and useful present CAD library model when preparing the new CAD library model. Further, the data editing and processing means 10 prepares the text data of the ASCII image which is divided into the character data and the coordinate data. This text data is used as the working file in order to newly prepare or change the CAD model based on the input data.

Further, for the text data, in accordance with the external instruction data 2 of the input means 15, the library preparing and processing means 16 prepares the CAD library model which includes the names of signal and connection lines, i.e., connection information for the circuit model. Further, in the design method of the logic circuit, it is possible to realize a design method for the logic circuit which omits the connection process for the logic circuit model.

Each component of FIG. 2 is explained in detail below. In accordance with the file 12 for the external instruction data 1, the data and processing editing means 10 prepares a similar library, symbol data and part external data as explained in detail below.

A similar library is prepared in the following four cases, i.e., (1) the case that only the library name (part name of circuit) is different but all other portions are the same, (2) the case that the number of round conductors (below, round) in the part external data increases or decreases, (3) the case that only the part function is different but all other data are the same, and (4) the case that a part of the present library is different.

The symbol data is prepared in accordance with the number of symbol pins, function name, and the symbol name of the current present library.

The part external data is prepared in accordance with the number of pins, a kind of round, and the part external shape name of the current library.

Next, in accordance with the external instruction data 2 in the file 15 for the external instruction data, the data editing and processing means 10 prepares three connection information for the circuit model. First, the data is prepared for a signal coupler for the particular symbol data and pin data (see, FIG. 5A). Second, the connection data is prepared for the circuit model regarding the coupling states for more than two symbols (see, FIG. 5B). Third, the connection data for the circuit model is prepared for the same function name and the pin name (see, FIG. 5D).

Next, the management file 13 for the CAD library model includes the following (1) the state data of the present library for reception/registration/change, for example, circuit part name, reception data, registration date, change date, and the content of change;

(2) a list of the function data of the present library, for example, voltage rating, current rating, resistance and capacitance.

(3) a list of the symbol data of the present library, for example, a symbol name, a symbol size, a symbol pin name, a pin function name, and the number of symbol pin;

(4) a list of the part external shape in the present library, for example, a name of a type, a part external size, the number of pin, and a kind of round name; and (5) a list of the part of the present library, for example, a circuit part name, a pin name, a kind of pin (POW/GND/NC), a name of a type.

Next, one example of the function of the data editing and processing means 10 is explained below.

First, the data editing and processing means 10 extracts the present library data and the external instruction data as the control data. That is, the data editing and processing means 10 inputs the part data, for example, the symbol data and the part shape data, which can previously confirm the possibility of utilization. Further, the data editing and processing means 10 inputs the part shape data, for example, the number of the pin of the part, the round size, and the round pitch. Further, the data editing and processing means 10 inputs the symbol data, for example, the function name and the number of the pins of the symbol.

Next, the data editing and processing means 10 confirms the contents of the data change and revision. That is, the data editing and processing means 10 confirms the different portions between the selected present data and the new data to be prepared based on the contents of the management file 13 and the external instruction data, prepares necessary data as the text data, and automatically prepares the data to be stored in the management file 13.

The management file 13 includes the following contents: a circuit part name (for example, LS04), a version number (for example, 01-02), a date of the change (for example, 920827), contents of the change (for example, LAND CHG), a date of the reception (for example, 920801), and a date of the preparation (for example, 920802).

FIG. 3 is schematic block diagram of a preparation system for CAD library model used in the present invention. As explained above, the present CAD library model in the file 11 and the external instruction data 1 are input to the data editing and processing means 10. The data editing and processing means 10 performs the automatic selection and edition of the present CAD library model through the management file 13. Further, the data editing and processing means 10 receives the external instruction data 2 regarding the connection information of the circuit model, and prepares the text data and performs the connection process of the circuit model. These data are stored in the work file 14 in accordance with the ASCII image as the character data plus the coordinate data and the connection information of the circuit model.

Further, the library preparing and processing means 16 performs the preparation and addition of the CAD library model, and stores the CAD library model into the new CAD library file 17. As a result, the circuit model is prepared and drawn on the automatic circuit model display apparatus 18. Further, the circuit model is stored in the circuit model file 19.

Figure 4A:
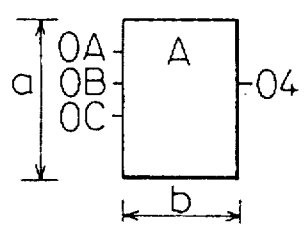
FIGS. 4A and 4B are explanatory views of symbol and part external shape information used in preparation of a CAD library model of the present invention.
Figure 4B:
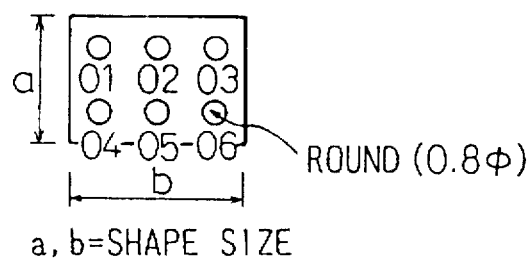

FIGS. 4A and 4B are explanatory views of the symbol and part external shape information used in the preparation of CAD library model of the present invention. FIG. 4A shows one example of the symbol data, and FIG. 4B shows one example of the part external-shape data. In FIG. 4A, "AA" denotes a function name, and OA to OC denotes symbol pins. Further, "a" and "b" denote size of the symbol. In FIG. 4B, the numerals 01 to 06 denote rounds each having diameter 0.8φ. Further, "a" and "b" denote external sizes.

Further, the function information of the part includes, for example, the AND gate, the FF circuit, the voltage rating, the current rating, the resistance and the capacitance. Still further, the information of part-pin includes, for example, a kind of pin (for example, the number "03" of the round denotes GND, and the number "06" of the round denotes +5v), and the pin name (for example, OA=01, Ob=02).

Still further, the names of the circuit part are formed of the following items: (1) the symbol data (symbol size, pin, etc.); (2) the part external shape (external size, kind of round and pin coordinate); and (3) part function data (kind of pin, pin name, etc.).

Still further, the circuit model is formed from the logic information of the LSI and the printed-circuit which connects the CAD library model in the design of the logic circuit. It is possible to provide the connection function of the automatic circuit model by previously inserting the connection data into each CAD library model at the design of the logic circuit and by setting the CAD library model.

FIGS. 5A to 5F are explanatory views of the CAD library model. These drawings include connection information for the circuit model.

Figure 5A:
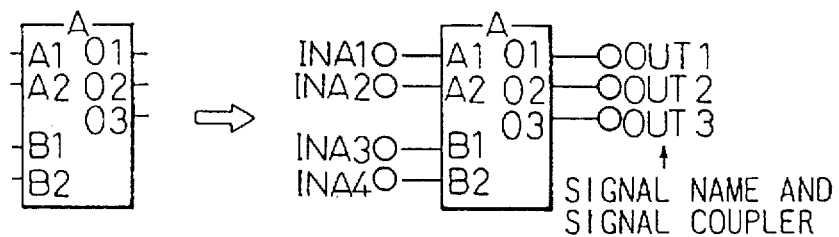

FIG. 5A is an explanatory view of the signal name and the signal coupler. In the drawing, A1, A2, B1 and B2 denote symbols of the input side, and 01 to 03 denote symbols of the output side. Further, INA1 to INA4 denote signal names, and OUT 1 to OUT 3 denote signal couplers. When symbols are arranged in the input and output sides, the signal names and signal couplers are automatically prepared.

Figure 5B:
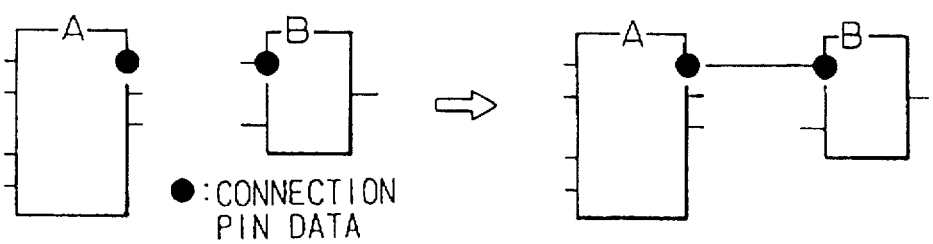

FIG. 5B is an explanatory view of connection data which is intended to the previously connected within the same page. The symbol expressed by a black dot "●" denotes a pin connection information designated by the operator (i.e., connection pin data). The connection is automatically performed between symbols, i.e., between black dots.

Figure 5C:
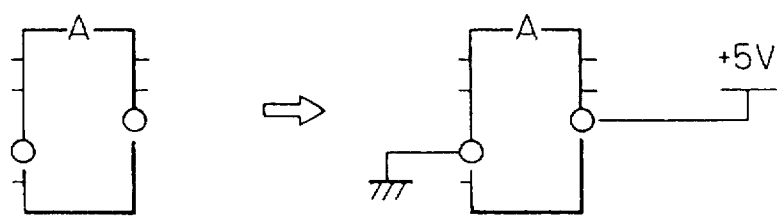

FIG. 5C is an explanatory view of connection of power and ground terminals. The symbol expressed by a circle "○" denotes a connection terminal. In this example, the circle of the input side is automatically connected to the ground, and that of the output side is automatically connected to the power(+5v).

Figure 5D:
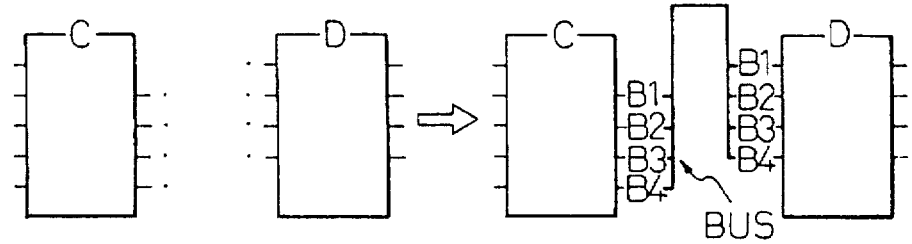

FIG. 5D is an explanatory view of connection data of bundled wires (BUS). Dots of the output side of the symbol data C (B1 to B4) and the input side of the symbol data D (B1 to B4) are connected by the bundled wires (BUS).

FIG. 5E is an explanatory view of the data preparation based on expression of a description language using NET. The NET portion is automatically prepared in this apparatus.

FIG. 5F is an explanatory view of connection information in the library data. As shown in the drawing, the connection information in the library data is expressed by the formula A(C)-B(02).

FIGS. 6A to 6E show one example of a detailed working file according to the present invention. This example denotes the data expressed by the text image in order to prepare the CAD library, and includes all data regarding the present library. Further, in this example, the symbol data, part shape data and the part data are expressed by groups of the character data plus the coordinate data (pattern image data). That is, FIGS. 6A and 6B show symbol data, FIGS. 6C and 6D show part shape data, and FIG. 6E shows part data.

The following are the detailed example of connection data of the circuit model. These examples are provided as the symbol data, and designed as follows.

(1) SYMBOL 1 : XXXXX—all pins: signal coupler generation terminal (2) SYMBOL 1 : fffff—BUS: destination symbol: destination IN/OUT side key The following examples are provided as the data of the symbol pin, and designed as follows.

(1) PIN: (OA)—(page name) : destination symbol: destination pin name (2) PIN: (OB)—(signal coupler generation terminal)

I claim:

1. A preparation system for CAD library model, comprising:

a library model file for storing present CAD library models which were previously prepared;

a first external data file for storing first external data, which include detailed data to prepare new library data to be registered, inputted by an operator;

a management file for storing structure and function of each CAD library model in the form of lists;

a work file for storing text data including character data, coordinate data of the character data and connection data of a circuit model;

a second external data file for storing second external data which include the connection data inputted by the operator;

data editing and processing means for receiving the present CAD library models from the library model file and the first external instruction data from the first external data file, extracting model data, which are relevant to the detailed data, from the management file, selecting an optimum model data which is the most relevant to the library model to be prepared, inputting present data, which is relevant to the selected optimum model data, from the present CAD library model, registering the optimum present data into the management file, preparing text data which are converted from the present library model data to ASCII image data consisting of character data and coordinate data, editing the text data by the operator and storing text data in the work file, and performing connection processes based on the second external data in order to prepare connection data provided by the text data and storing new second external data as the connection data in the work file;

preparation and addition means for preparing the new CAD library models and adding the new CAD library models to the present CAD library model in accordance with contents of the data editing and processing means and the work file by updating the present library model data based on the text data after conversion from the ASCII image data to the present library model data; and a new CAD library model file for storing new CAD library models received from the preparation and addition means.

2. A preparation system as claimed in claim 1, wherein said detailed data include library model names, function data, physical data including part shape data and pin position data, and logical data including symbol data.

3. A preparation system as claimed in claim 1, wherein the character data and coordinate data include the symbol data, part shape data and part data.

4. A preparation system as claimed in claim 1, wherein each of said lists include CAD library model names, function data, physical data, logical data, and preparation data of the CAD library model.

5. An apparatus comprising:

a CAD library which stores CAD library models; and an editing mechanism which receives instruction data for preparing a new CAD library model, selects a CAD library model of the stored CAD library models which is most similar to the new CAD library model, and revises the selected CAD library model in accordance with the instruction data to prepare the new CAD library model.

6. An apparatus as in claim 5, wherein the instruction data is manually input to the apparatus by a user.

7. An apparatus as in claim 5, wherein, when revising the selected CAD library model, the editing mechanism revises the selected CAD library model to prepare data for an ASCII image of the new CAD library model and the new CAD library model is prepared from the data for the ASCII image.

8. A method comprising the steps of:

receiving instruction data for preparing a new CAD library model;

selecting a CAD library model from a CAD library which stores CAD library models, the selected CAD library model being most similar to the new CAD library model of the stored CAD library models; and revising the selected CAD library model in accordance with the received instruction data to prepare the new CAD library model.

9. A method as in claim 8, wherein the step of revising the selected CAD library model comprises the steps of:

revising the selected CAD library model to prepare data for an ASCII image of the new CAD library model; and preparing the new CAD library model from the data for the ASCII image.

* * * * *

UNITED STATES PATENT AND TRADEMARK OFFICE
CERTIFICATE OF CORRECTION

PATENT NO. : 5,754,842
DATED : May 19, 1998
INVENTOR(S) : Eiji MINAGAWA

It is certified that error appears in the above-identified patent and that said Letters Patent is hereby corrected as shown below:

Col. 1, line 65, delete "means".

Col. 6, line 63, change " "AA" " to --"A"--.

Signed and Sealed this

Eighth Day of September, 1998

Attest:

BRUCE LEHMAN

Attesting Officer          Commissioner of Patents and Trademarks